US012476087B2

(12) United States Patent
Prager et al.

(10) Patent No.: US 12,476,087 B2
(45) Date of Patent: Nov. 18, 2025

(54) SYSTEM AND METHOD FOR ION SOURCE TEMPERATURE CONTROL USING SYMMETRIC OR ASYMMETRIC APPLICATION OF FORCE

(71) Applicant: Applied Materials, Inc., Santa Clara, CA (US)

(72) Inventors: Ryan Prager, Beverly, MA (US); John Alexander Walder, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 417 days.

(21) Appl. No.: 18/143,684

(22) Filed: May 5, 2023

(65) Prior Publication Data

US 2024/0371608 A1 Nov. 7, 2024

(51) Int. Cl.
*H01J 37/32* (2006.01)

(52) U.S. Cl.
CPC .................. *H01J 37/32522* (2013.01); *H01J 37/32055* (2013.01); *H01J 37/32412* (2013.01);
(Continued)

(58) Field of Classification Search
CPC .... H01J 37/08; H01J 37/3171; H01J 37/3244; H01J 37/3007; H01J 37/023;
(Continued)

(56) References Cited

U.S. PATENT DOCUMENTS 9,859,098 B2 1/2018 Holden et al.
10,325,752 B1 6/2019 Calkins et al.
(Continued)

FOREIGN PATENT DOCUMENTS

CN 111902906 A 11/2020
CN 114864373 A 8/2022
(Continued)

OTHER PUBLICATIONS

International Search Report and Written Opinion mailed Aug. 7, 2024 in corresponding PCT application No. PCT/US2024/022980.
(Continued)

*Primary Examiner* — David E Smith
*Assistant Examiner* — Hsien C Tsai
(74) *Attorney, Agent, or Firm* — Nields, Lemack & Frame, LLC

(57) ABSTRACT

An ion source is disclosed, in which the compression force applied to the faceplate on the two sides of the extraction aperture may be varied independently. Modifying the compression force between the faceplate and arc chamber can enable temperature control of the ion source by modifying the thermal contact resistance between the two components. This may allow more control of the temperature of the faceplate, and more specifically, the temperature profile across the entire faceplate due to precise control of the thermal contact gradient along the length of the faceplate. The ion implantation system includes two adjustable tension systems, each of which includes an actuator. A controller is used to provide a command signal to each adjustable tension system. In some embodiments, a feedback signal is generated by each adjustable tension system, which is representative of the torque or force experienced by the actuator.

18 Claims, 10 Drawing Sheets

(52) U.S. Cl.
CPC .................. *H01J 2237/0455* (2013.01); *H01J 2237/08* (2013.01); *H01J 2237/24585* (2013.01); *H01J 2237/3365* (2013.01)

(58) Field of Classification Search
CPC ........... H01J 2237/006; H01J 2237/024; H01J 2237/022; H01J 2237/082; H01J 2237/061; H01J 2237/032
See application file for complete search history.

(56) References Cited

U.S. PATENT DOCUMENTS

| | | | |
|---|---|---|---|
| 10,347,457 | B1 | 7/2019 | Perel, Sr. et al. |
| 2002/0130278 | A1 | 9/2002 | Vella |
| 2007/0107841 | A1 | 5/2007 | Horsky et al. |
| 2008/0067412 | A1 | 3/2008 | Vanderberg et al. |
| 2015/0130353 | A1 | 5/2015 | Lin et al. |
| 2015/0179393 | A1 * | 6/2015 | Colvin .................... H01J 37/08 250/427 |
| 2015/0357152 | A1 | 12/2015 | Jones et al. |
| 2017/0178857 | A1 | 6/2017 | Holden et al. |
| 2019/0189387 | A1 * | 6/2019 | Perel ................... H01J 37/3007 |
| 2021/0110995 | A1 | 4/2021 | Patel et al. |
| 2022/0122811 | A1 | 4/2022 | Mutyala et al. |
| 2024/0379319 | A1 | 11/2024 | Walder |

FOREIGN PATENT DOCUMENTS

| | | | |
|---|---|---|---|
| JP | 2001-210245 | A | 8/2001 |
| JP | 2017-228373 | A | 12/2017 |
| KR | 2009-0029212 | A | 3/2009 |
| TW | M374647 | U | 2/2010 |
| TW | 202046364 | A | 12/2020 |
| TW | 202129677 | A | 8/2021 |
| WO | 2016/170703 | A1 | 10/2016 |

OTHER PUBLICATIONS

International Search Report and Written Opinion mailed Jul. 23, 2024 in co-pending PCT application No. PCT/US2024/022995.

International Search Report and Written Opinion mailed Jul. 22, 2025 in co-pending PCT application No. PCT/US2025/023697.

Notice of Allowance mailed Jul. 8, 2025 in co-pending U.S. Appl. No. 18/144,367.

* cited by examiner

SYSTEM AND METHOD FOR ION SOURCE TEMPERATURE CONTROL USING SYMMETRIC OR ASYMMETRIC APPLICATION OF FORCE

FIELD

Embodiments of the present disclosure relate to systems and methods of controlling a temperature of an ion source by application of force to the faceplate.

BACKGROUND

The fabrication of a semiconductor device involves a plurality of discrete and complex processes. One such process may utilize an ion beam, which may be extracted from an ion source. In an ion source, a feed gas is energized to form ions. Those ions are then extracted from the ion source through an extraction aperture disposed on a faceplate. The ions are manipulated downstream by a variety of components, including electrodes, acceleration and deceleration stages, and mass analyzers.

One such ion source is an indirectly heated cathode ion source. An indirectly heated cathode (IHC) ion source operates by supplying a current to a filament disposed behind a cathode. The filament emits thermionic electrons, which are accelerated toward the cathode via an applied electric potential, which in turn heats the cathode causing electrons to be emitted into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, referred to as the faceplate. The extraction aperture is located proximate to the center of the arc chamber, through which the ions created in the arc chamber may be extracted.

In some situations, material may be deposited on the interior surface of the faceplate, which may lead to a non-uniform ion beam. This material may be created by the condensation of the feed gas species on cooler surfaces. Alternatively, material deposition on the interior surface of the faceplate may, in some systems, occur preferentially on the warmer surfaces depending on the feed gas species. The rate of deposition may be related to the temperature of the faceplate. In many IHC ion sources, the side of the faceplate nearest to the cathode may be warmer than the side of the faceplate furthest from the cathode due to proximity to the thermally radiating cathode. Thus, the deposition of material may be uneven, causing a non-uniform extracted ion beam.

Therefore, it would be beneficial if there was a system that controlled the temperature of the faceplate to reduce material buildup.

SUMMARY

An ion source is disclosed, in which the compression force applied to the faceplate on the two sides of the extraction aperture may be varied independently. Modifying the compression force between the faceplate and arc chamber can enable temperature control of the ion source by modifying the thermal contact resistance between the two components. This may allow more control of the temperature of the faceplate, and more specifically, the temperature profile across the entire faceplate due to precise control of the thermal contact gradient along the length of the faceplate. The ion implantation system includes two adjustable tension systems, each of which includes an actuator. A controller is used to provide a command signal to each adjustable tension system. In some embodiments, a feedback signal is generated by each adjustable tension system, which is representative of the torque or force experienced by the actuator. This feedback signal may be used to adjust the command signal supplied to each adjustable tension system.

According to one embodiment, an ion implantation system is disclosed. The ion implantation system comprises an ion source comprising an arc chamber comprising a plurality of chamber walls and having a first end and a second end; and a faceplate having an extraction aperture disposed on a top of the plurality of chamber walls; a source housing, wherein the arc chamber is disposed on the source housing; a first fastener and a second fastener to press the faceplate against the top of the plurality of chamber walls of the arc chamber, wherein the first fastener is disposed near the first end and the second fastener is disposed near the second end; and a first adjustable tension system in communication with the first fastener to apply tension to the first fastener and a second adjustable tension system in communication with the second fastener to apply tension to the second fastener; and a controller, in communication with the first adjustable tension system and the second adjustable tension system, configured to apply different tensions to each fastener. In some embodiments, the tension applied to the first end, which is proximate to a cathode in the arc chamber, is greater than the tension applied to the second end so as to increase a temperature of the faceplate. In some embodiments, the tension applied to the first end, which is proximate to a cathode in the arc chamber, is less than the tension applied to the second end so as to decrease a temperature of the faceplate. In some embodiments, the controller receives an input, and based on the input, determines a desired tension for the first adjustable tension system and a desired tension for the second adjustable tension system. In certain embodiments, the input is a feed gas species being used, a desired temperature, or a desired force. In some embodiments, each fastener comprises a strap, wherein the strap comprises an engagement portion that rests on the faceplate and two attachment portions, where the two attachment portions are coupled to a respective adjustable tension system.

According to another embodiment, an ion implantation system is disclosed. The ion implantation system comprises an ion source comprising an arc chamber comprising a plurality of chamber walls and having a first end and a second end; and a faceplate having an extraction aperture disposed on a top of the plurality of chamber walls; a source housing, wherein the arc chamber is disposed on the source housing; a first fastener and a second fastener to press the faceplate against the top of the plurality of chamber walls, wherein the first fastener is disposed near the first end and the second fastener is disposed near the second end; and a first adjustable tension system in communication with the first fastener to apply tension to the first fastener and a second adjustable tension system in communication with the second fastener to apply tension to the second fastener; wherein each adjustable tension system comprises an actuator and a tension system, wherein the tension system comprises a yoke to attach to a respective fastener, a retaining bracket, and a spring disposed between the yoke and the retaining bracket; and wherein the actuator includes a shaft and wherein movement of the shaft varies a distance between the retaining bracket and the yoke. In some embodiments, the source housing comprises a housing body having a cylindrical shape, and wherein flat regions are created on the housing body to mount the tension system. In some embodiments, the source housing comprises a flange disposed proximate to the arc chamber, wherein the flange is disposed between the arc chamber and the tension system; and wherein the flange comprises slots through which the fasteners pass. In some embodiments, the actuator comprises a linear actuator and the shaft is affixed to the retaining bracket. In some embodiments, each adjustable tension system further comprises a ball screw that passes through an interior of the spring and is rotatably coupled to the retaining bracket, wherein the actuator comprises a rotary motor, and a gear disposed at a distal end of the shaft, wherein the gear engages with a ball screw gear that turns the ball screw. In certain embodiments, the source housing has a hollow interior, and the tension system is mounted on an outside wall of the source housing and the actuator is disposed within the source housing. In certain embodiments, a slot is disposed in the source housing connecting the hollow interior to the outside wall, wherein the gear extends through the slot to connect the actuator to the tension system. In some embodiments, the arc chamber and the source housing are disposed in a vacuum chamber, the tension system is mounted on an outside wall of the source housing and the actuator is disposed outside the vacuum chamber, such that the shaft passes from an atmospheric environment into the vacuum chamber.

According to another embodiment, an ion implantation system is disclosed. The ion implantation system comprises an ion source comprising an arc chamber comprising a plurality of chamber walls and having a first end and a second end; and a faceplate having an extraction aperture disposed on top of the plurality of chamber walls; a source housing, wherein the arc chamber is disposed on the source housing; a first fastener disposed near the first end and a second fastener disposed near the second end; and a first adjustable tension system in communication with the first fastener to apply tension to the first fastener and a second adjustable tension system in communication with the second fastener to apply tension to the second fastener, wherein each adjustable tension system comprises an actuator; and a controller, in communication with the first adjustable tension system and the second adjustable tension system, to supply a desired tension to each adjustable tension system, wherein the controller supplies a command signal to each adjustable tension system and receives a feedback signal from each adjustable tension system, wherein the feedback signal is indicative of actual tension experienced by each adjustable tension system. In some embodiments, the controller updates the command signal to each adjustable tension system based on a respective feedback signal. In some embodiments, the controller updates the command signal a plurality of times. In certain embodiments, the controller updates the command signal at least once per minute.

BRIEF DESCRIPTION OF THE FIGURES

For a better understanding of the present disclosure, reference is made to the accompanying drawings, which are incorporated herein by reference and in which.

DETAILED DESCRIPTION

As described above, the temperature of the faceplate in an IHC ion source may affect the rate of deposition of material on the interior surface of the faceplate. The thermal gradient across the faceplate during operation may result in non-uniform deposition across the faceplate and extraction aperture, which results in non-uniform ion extraction from the IHC ion source due to the resulting non-uniform extraction aperture dimensions. This deposition may contribute to nonuniformity of the ion beam and increased maintenance.

Figure 1A:
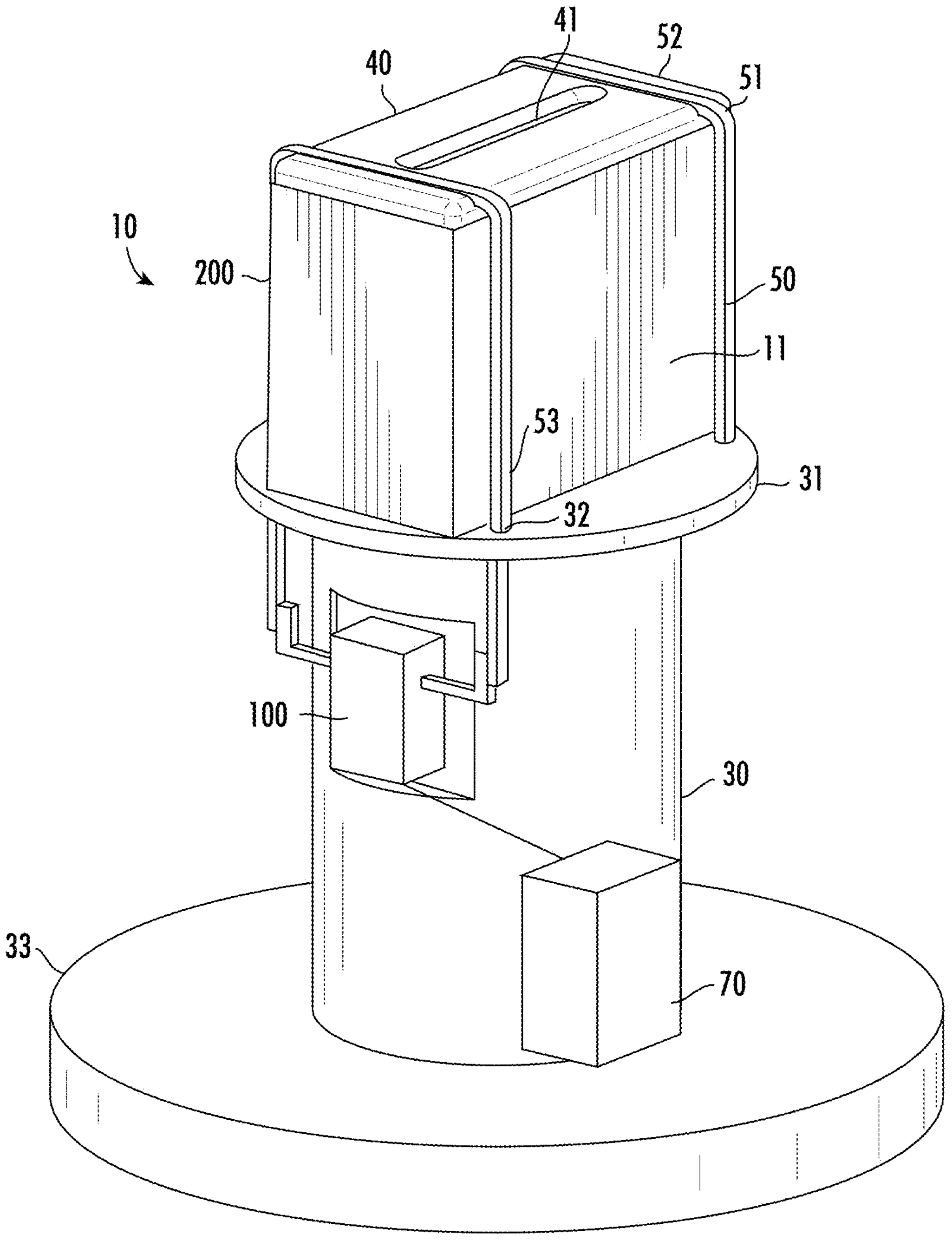
FIG. 1A is a view of the ion source according to one embodiment.

FIG. 1A shows an ion source with temperature control of the faceplate according to one embodiment. The ion source 10 includes a plurality of chamber walls 11 that define an arc chamber 200. A faceplate 40 having an extraction aperture 41 may be disposed against the tops of the chamber walls 11. The faceplate 40 may be a single component, or may be comprised of a plurality of components. For example, in one embodiment, the faceplate 40 includes a faceplate insert that is disposed beneath the outer faceplate and helps define the extraction aperture 41. Thus, the term "faceplate" as used in this disclosure refers to any component or components that make up the structure that includes the extraction aperture through which the ions are removed. Within the arc chamber 200 may be a mechanism to create ions. For example, in one embodiment, an indirectly heated cathode (IHC) may be disposed within the arc chamber.

The faceplate 40 is secured to the source housing 30 using a plurality of fasteners, which, in this embodiment, may be two straps 50. The source housing 30 may include a flange 31 having holes or slots 32 through which the straps 50 pass. The straps 50 are held in place using an adjustable tension system 100. The arc chamber 200 may be attached to the source housing 30. In certain embodiments, the source housing 30 may be temperature controlled. For example, the source housing 30 may be attached to a heat sink, or may be a heat sink itself. Thus, the chamber walls 11 are in direct thermal contact with the source housing 30. This may serve to cool the chamber walls 11. The source housing 30 may include a lower flange 33. This lower flange 33 may separate the vacuum chamber, where the ion source 10 is located, from the atmospheric environment. Thus, components located below the lower flange 33 may be in the atmospheric environment, while those above the lower flange 33 are in the vacuum chamber.

The straps 50 may be formed having a cross-section that is a rounded rectangle. The cross section of the strap 50 has a width and a thickness, where the width may be larger than the thickness. The width of the straps 50 may be between 0.25 inches and 1 inch, while the thickness may be between 1/16 and 1/4 inches. The straps 50 comprise three straight portions, which are separated by rounded portions 51. The rounded portions 51 may include a bend, having a radius of curvature. The radius of curvature of the rounded portions may be between 0.25 inches and 1.00 inches. In some embodiments, the bend is a 90° bend, but in other embodiments, the bend may be between 45° and 135°. Between the rounded portions 51 is the engagement portion 52. As seen in FIG. 1A, the engagement portion 52 of the strap 50 is the portion that rests against the outer surface of the faceplate 40. In some embodiments, the length of the engagement portion 52 is slightly longer than the width of the faceplate 40 such that the engagement portion 52 contacts the entirety of the width of the faceplate 40. For example, the engagement portion 52 of the strap 50 may be between 1 and 6 inches, although other dimensions are also possible. On the opposite side of each rounded portion 51 is the attachment portion 53. Each attachment portion 53 may have a length that is greater than the height of the arc chamber 200. For example, the attachment portions 53 may have a length that may be between 4 and 10 inches, although other dimensions may also be used. As best seen in FIG. 1A, the attachment portions 53 of the straps 50 may pass through slots 32 or openings in the flange 31. A hole may be disposed near the distal end of each attachment portion 53. This hole is used to attach the straps 50 to an adjustable tension system 100. The first fastener is disposed near the first end 201 (see FIG. 2) of the arc chamber 200 and the second fastener is disposed near the second end 202 (see FIG. 2) of the arc chamber 200. There is a first adjustable tension system 100 associated with the cathode side (i.e. the first end 201) of the faceplate 40 and a second adjustable tension system 100 associated with the repeller side (i.e. the second end 202) of the faceplate 40.

Figure 3:
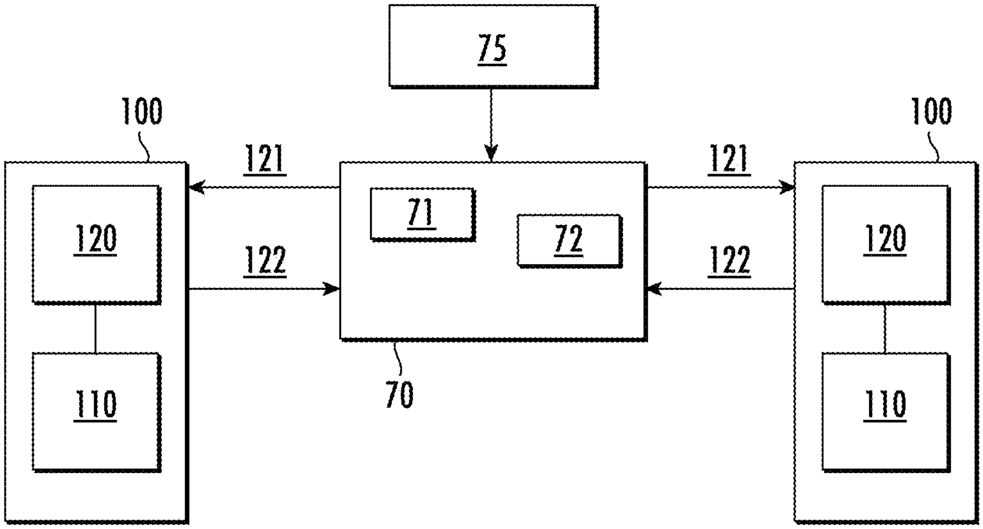
FIG. 3 is a block diagram of the control system.

The adjustable tension system 100 comprises a tension system 110, which may include a spring, and an actuator 120 (see FIG. 3). The actuator 120 is used to vary the length of the spring, which results in a variation in the compression force applied to the faceplate 40 by the straps 50. The tension system 110 is positioned such that the flange 31 is located between the arc chamber 200 and the tension system 110.

The adjustable tension system 100 may be in communication with a controller 70. The controller 70 includes a processing unit 71 and an associated memory device 72 (see FIG. 3). This memory device 72 contains the instructions, which, when executed by the processing unit 71, enable the controller 70 to perform the functions described herein. This memory device 72 may be a non-volatile memory, such as a FLASH ROM, an electrically erasable ROM or other suitable devices. In other embodiments, the memory device 72 may be a volatile memory, such as a RAM or DRAM. The processing unit 71 may be a general purpose computer, a special purpose computer, a microcontroller or another type of electrical circuit. The controller 70 may output one or more electrical signals to the actuator 120, as described in more detail below.

Figure 1B:
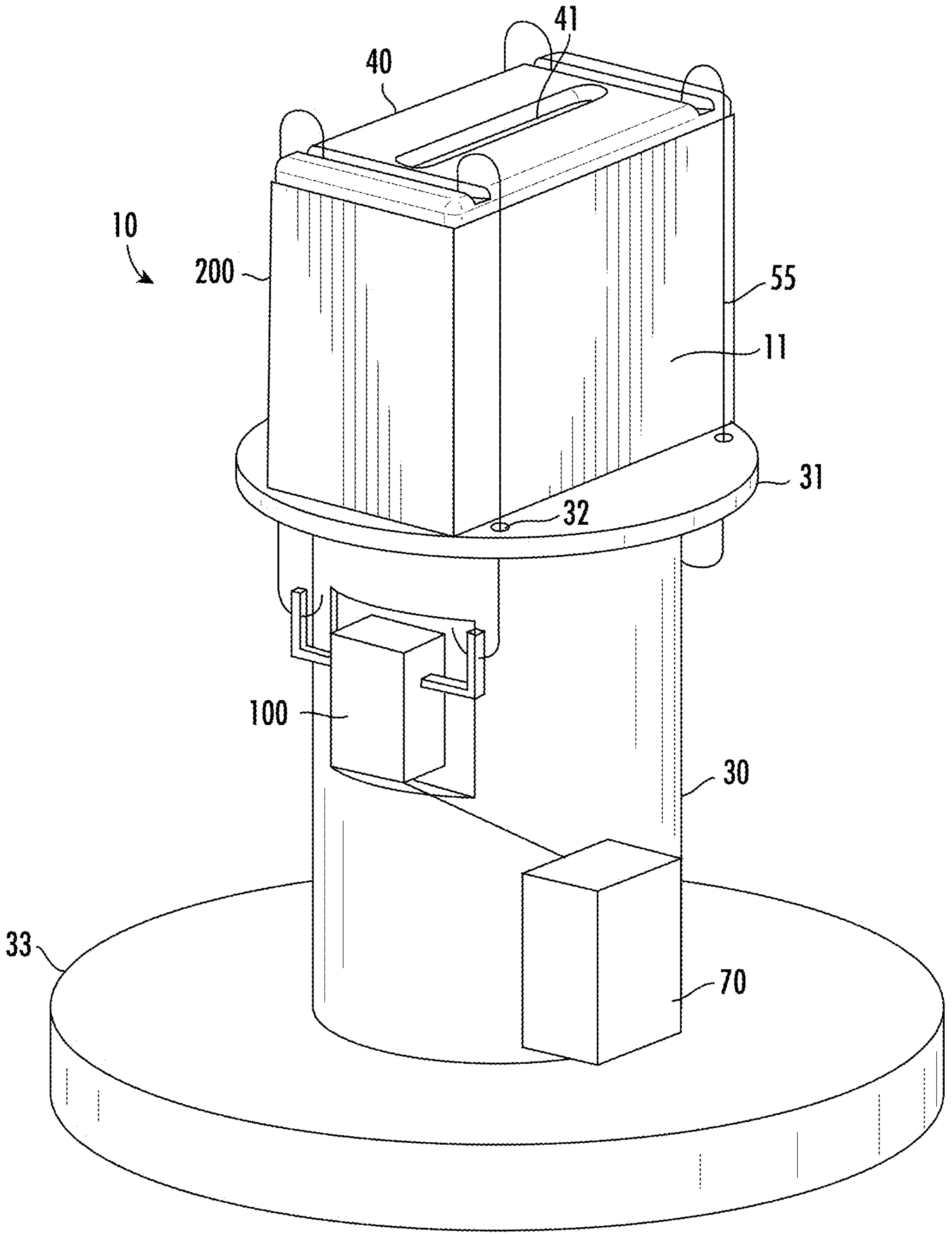
FIG. 1B is a view of the ion source according to a second embodiment.

FIG. 1B shows the ion source with temperature control of the faceplate 40 according to a second embodiment. Identical components have been given the same reference designators. In this embodiment, each fastener is a set of two hooks 55, rather than a strap. Each hook may include a rounded end which is disposed in a recess in the top surface of the faceplate 40. The distal end of each hook may include another rounded end for attachment to the adjustable tension system 100. The remainder of the ion source is similar to that shown in FIG. 1A.

Figure 2:
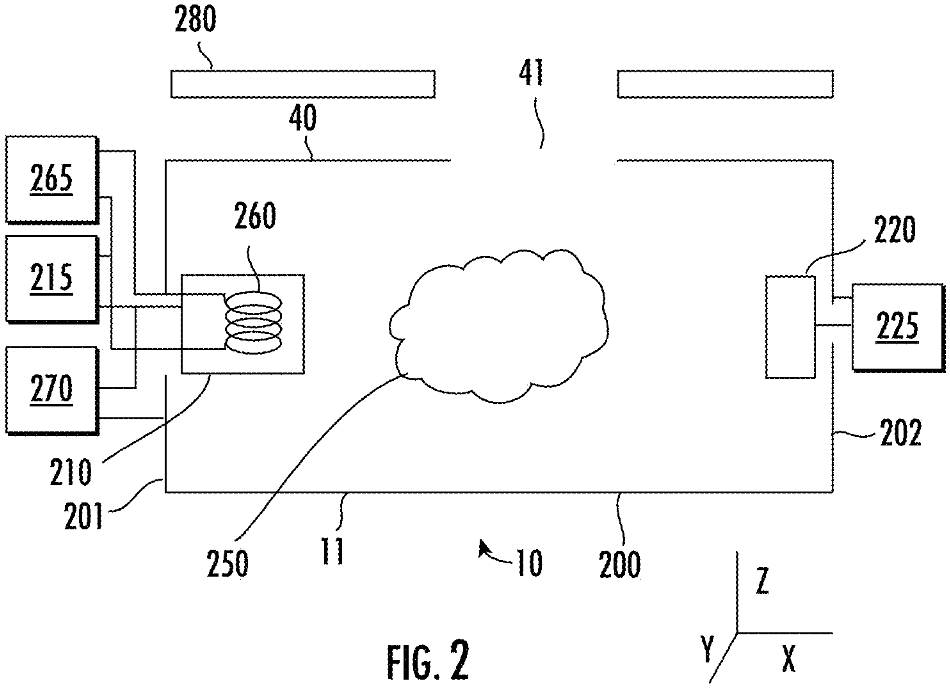
FIG. 2 is a side view of the interior of the ion source of FIGS. 1A-1B.

FIG. 2 shows a side view of the electronics and interior of the ion source 10 according to one embodiment. In this embodiment, the ion source 10 includes an arc chamber 200, comprising two opposite ends, and chamber walls 11 connecting to these ends. The arc chamber 200 also includes a bottom wall and faceplate 40. The chamber walls 11 may be constructed of an electrically and thermally conductive material and may be in electrical contact with one another. A cathode 210 is disposed in the arc chamber 200 at a first end 201 of the arc chamber 200. A filament 260 is disposed behind the cathode 210. The filament 260 is in communication with a filament power supply 265. The filament power supply 265 is configured to pass a current through the filament 260, such that the filament 260 emits thermionic electrons. Cathode bias power supply 215 biases filament 260 negatively relative to the cathode 210, so these thermionic electrons are accelerated from the filament 260 toward the cathode 210 and heat the cathode 210 when they strike the back surface of cathode 210. The cathode bias power supply 215 may bias the filament 260 so that it has a voltage that is between, for example, 200V to 1500V more negative than the voltage of the cathode 210. The cathode 210 then emits thermionic electrons on its front surface into arc chamber 200.

Thus, the filament power supply 265 supplies a current to the filament 260. The cathode bias power supply 215 biases the filament 260 so that it is more negative than the cathode 210, so that electrons are attracted toward the cathode 210 from the filament 260. Additionally, the cathode 210 may be electrical biased relative to the arc chamber 200, using cathode power supply 270. Because of the power applied to the cathode 210 and the emission of electrons, the arc chamber 200 may be warmer near the cathode 210. This includes the portion of the faceplate 40 that is located near the cathode 210.

In this embodiment, a repeller 220 is disposed in the arc chamber 200 on the second end 202 of the arc chamber 200 opposite the cathode 210. The repeller 220 may be in communication with repeller power supply 225. As the name suggests, the repeller 220 serves to repel the electrons emitted from the cathode 210 back toward the center of the arc chamber 200. For example, the repeller 220 may be biased at a negative voltage relative to the arc chamber 200 to repel the electrons. For example, the repeller power supply 225 may have an output in the range of 0 to −150V, although other voltages may be used. In certain embodiments, the repeller 220 is biased at between 0 and −150V relative to the arc chamber 200. In other embodiments, the cathode power supply 270 is used to supply a voltage to the repeller 220 as well. In other embodiments, the repeller 220 may be electrically grounded or floating. In other embodiments, the repeller 220 may be omitted.

In operation, a gas is supplied to the arc chamber 200. The thermionic electrons emitted from the cathode 210 cause the gas to form a plasma 250. Ions from this plasma 250 are then extracted through an extraction aperture 41 in the faceplate 40. The ions are then manipulated to form an ion beam that is directed toward the workpiece. An extraction electrode 280 is disposed outside the arc chamber 200 and proximate the extraction aperture 41. The extraction electrode 280 is biased at a voltage different from the arc chamber 200 so as to attract ions from within the arc chamber 200 through the extraction aperture 41.

It is noted that other mechanisms for generating ions may be used. These other mechanisms include, but are not limited to, Bernas ion source, RF antennas, and capacitively coupled sources.

FIG. 3 shows a block diagram of the control system used to control the adjustable tension system 100. The controller 70 may be in communication with an input device 75, such as a keyboard, touchscreen or other device. The controller 70 is also in communication with two adjustable tension systems 100. As described above, the first adjustable tension system is used to control the compression force applied to the faceplate 40 near the first end 201, closest to the cathode 210, while the second adjustable tension system is used to control the compression force applied to the faceplate 40 near the second end 202, which is opposite the first end 201, and proximate to the repeller 220 (if present).

Each adjustable tension system 100 includes an actuator 120, which may be a rotary motor or a linear actuator, as described in more detail below. Each actuator 120 receives command signal 121 from the controller 70. The command signal 121 may be an analog signal, a time-varying analog signal having an amplitude, period and duty cycle, or a digital signal. The command signal 121 to the actuator 120 determines the amount of movement (either rotary or linear) that the actuator 120 will generate. In some embodiments, each actuator 120 also includes a feedback signal 122, which may be representative of the torque (for a rotary actuator) or force (for a linear actuator) that the actuator 120 is actually experiencing. Thus, the feedback signal 122 is indicative of the tension or compression force being applied to the fastener. This feedback signal 122 is provided to the controller 70, which may use this value to further adjust the command signal 121 to the actuator 120. As described above, the adjustable tension system 100 also includes a tension system 110, which typically includes at least one spring. In this way, the two adjustable tensions systems 100 may be independently controlled and the controller 70 may issue different command signals 121 to each adjustable tension system 100. Thus, the compression force applied by the first fastener near the first end 201 may be less than, greater than, or equal to the compression force applied by the second fastener near the second end 202 of the arc chamber 200.

Figure 4:
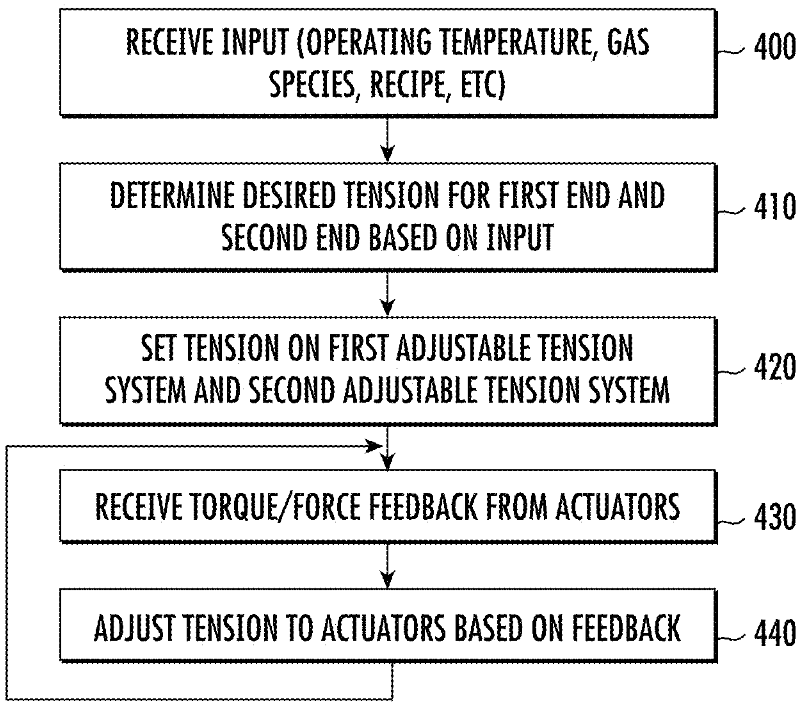
FIG. 4 shows the operation of the control system according to one embodiment.

FIG. 4 shows the operation of the control system shown in FIG. 3. First, as shown in Box 400, the controller 70 receives an input, such as from an operator via the input device 75. This input may be the desired forces to apply to the two ends of the IHC ion source in order to compress the respective ends of the faceplate 40 into the chamber walls 11 of the arc chamber. In other embodiments, the input may be the desired temperature of the faceplate 40, the feed gas species that is being introduced, the tensions to be applied to the fasteners, or the recipe, which is a list of parameters associated with the operation of the ion source 10. Based on this input, as shown in Box 410, the controller 70 determines the desired tension for the fastener associated with the first adjustable tension system (i.e. the first end 201) and for the fastener associated with the second adjustable tension system (i.e. the second end 202). The tension on the fasteners pulls down on the faceplate 40, which directly translates to application of a compression force of equal magnitude between the faceplate 40 and the arc chamber 200. The desired tensile or compression force may be determined using a lookup table stored in memory device 72 or by an equation executed by the processing unit 71. As noted above, the desired fastener tension may be different for the two adjustable tension systems. The controller 70 then provides the desired tension to each adjustable tension system 100 via the command signal 121, as shown in Box 420. In certain embodiments, the controller 70 then receives a feedback signal 122 from the actuators 120, which is indicative of the torque or force that the actuator is actually experiencing, as shown in Box 430. Based on this feedback, the controller 70 then adjusts the command signal 121 provided to the actuator 120 so that the feedback signal is a value that is equal to the desired tension, as shown in Box 440. In certain embodiments, the control system repeats Boxes 430-440 throughout the operation of the IHC ion source. For example, over time, the materials in the fastener assemblies may soften or relax, reducing the compression force on the faceplate 40. By continuing to monitor the feedback signal 122 and adjust the command signal 121, this relaxation may be compensated for, such that the compression force remains unchanged over time. In some embodiments, Boxes 430-440 are executed a plurality of times. In some embodiments, these Boxes may be executed at regular intervals. In some embodiments, Boxes 430-440 may be executed as frequently as every 1-5 milliseconds. In other embodiments, these boxes may be executed less frequently such as every 1 second or more. Thus, the rate of monitoring is not limited by this disclosure and may be any suitable duration, such as every 1 millisecond or more. In certain embodiments, Boxes 430-440 may be executed at least once per minute. In some embodiments, Boxes 430-440 may be executed at least once per hour.

Figure 5:
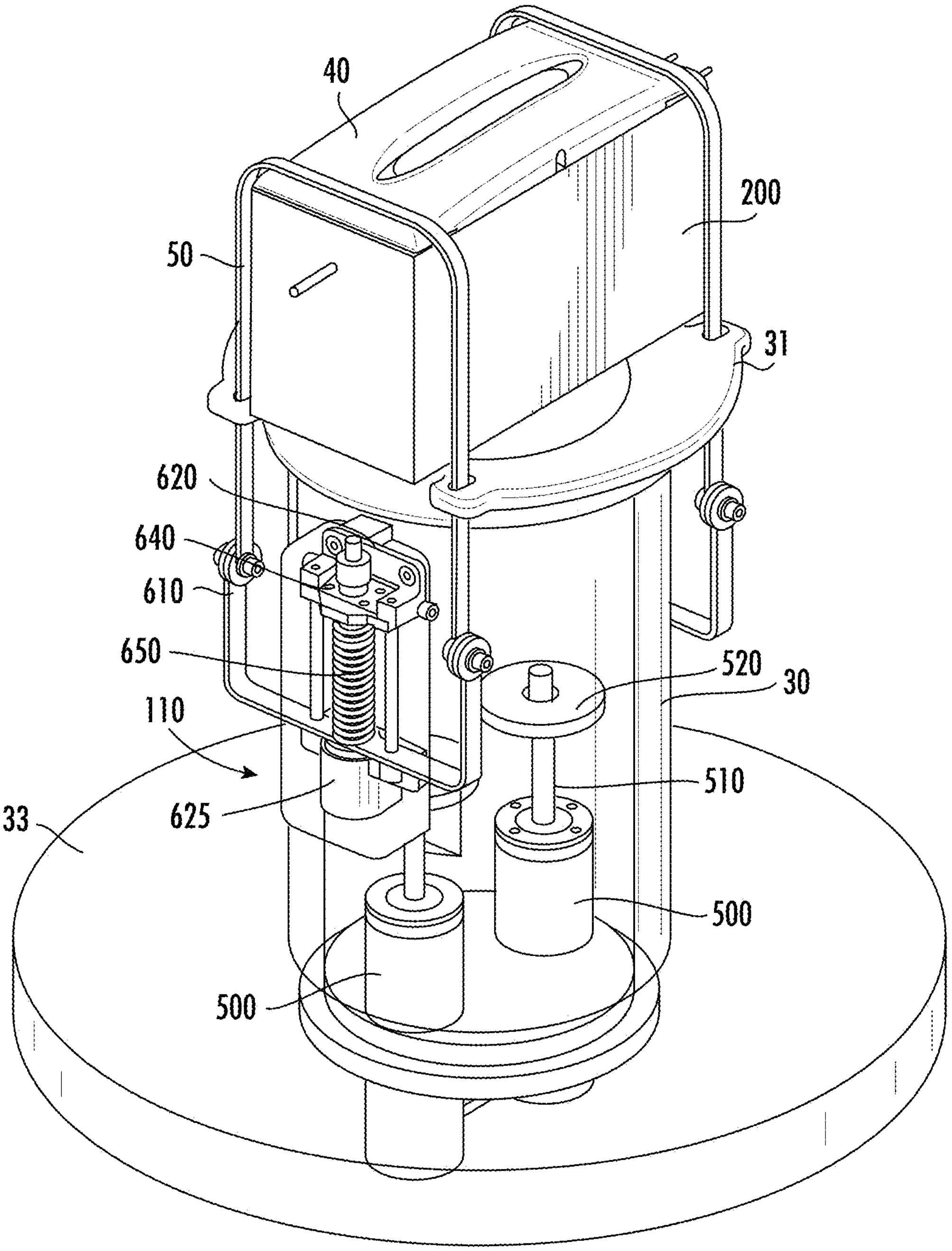
FIG. 5 shows the ion source with an adjustable tension system according to a first embodiment.

FIG. 5 shows a first embodiment of the ion implantation system that includes the control system described above. While straps 50 are shown, it is understood that the fasteners may be hooks 55. In this embodiment, each adjustable tension system 100 includes an actuator 120, which is a rotary motor 500. In this embodiment, the source housing 30 may have a hollow interior. The rotary motors 500 are located in a cavity within the source housing 30, which is disposed in the vacuum chamber. The rotary motor 500 is coupled to a shaft 510, on which a gear 520 is mounted. A slot 35 (see FIG. 9) is disposed in the wall of the source housing 30, which allows the gear 520 from the rotary motor 500 to pass through the wall of the source housing 30 and engage the tension system 110. The tension system 110 is mounted on the outer wall of the source housing 30. The tension system 110 includes a yoke 610, which is used to couple the fasteners to the tension system 110. While FIG. 5 shows the rotary motors 500 disposed in the vacuum chamber, other embodiments are possible. For example, the rotary motors 500 may be located outside of the vacuum chamber, such as on the atmospheric environment on the opposite side of the lower flange 33 of the source housing 30. A vacuum flange (not shown) may be used to allow the shaft 510 to pass from the atmospheric environment to the vacuum chamber.

Figure 6A:
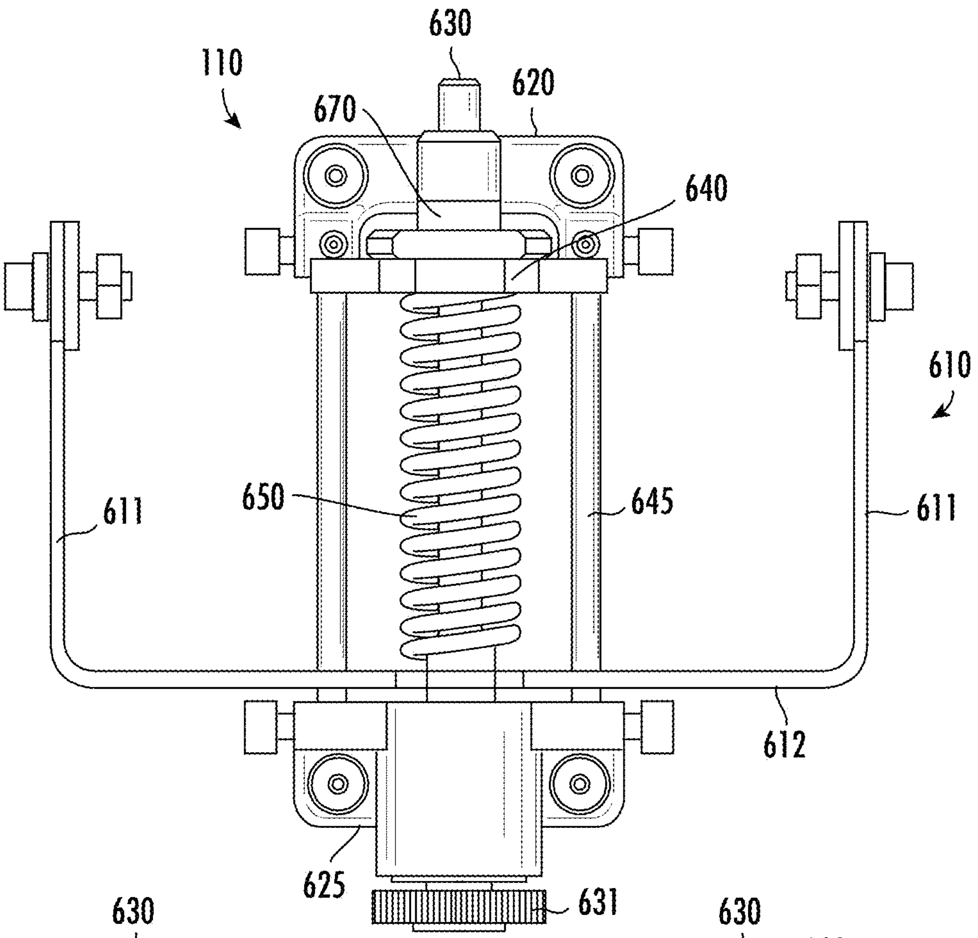
FIG. 6A-6C show the adjustable tension system used in various embodiments.
Figure 6B:
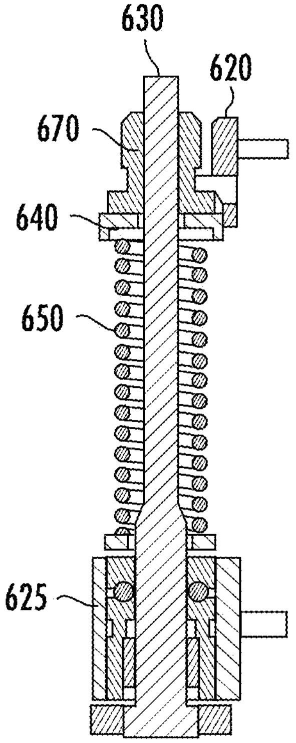
Figure 6C:
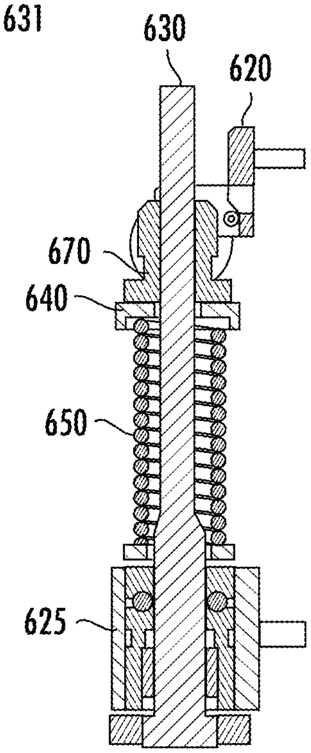

FIGS. 6A-6C show the tension system 110 in greater detail. In this embodiment, the tension system 110 includes an upper mounting bracket 620 and a lower mounting bracket 625, both of which are affixed to the outer wall of the source housing 30. The yoke 610, which attaches to the fasteners, includes two arms 611 and a central portion 612. The central portion 612 is inserted between the upper mounting bracket 620 and the lower mounting bracket 625 and includes a hole. A retaining bracket 640 is used to compress a spring 650, such that the spring 650 is disposed between the underside of the retaining bracket 640 and the top surface of the central portion 612 of the yoke 610. The retaining bracket 640 may include one or more guide rails 645 that extend through the central portion 612 to the lower mounting bracket 625. The guide rails 645 may be used to ensure stable uniaxial movement of the retaining bracket 640. A ball screw 630 is inserted through an opening in the lower mounting bracket 625. The shaft of the ball screw 630 passes through the hole in the central portion 612 of the yoke 610 and is disposed in the interior of the spring 650. The ball screw 630 passes through an opening in the retaining bracket 640. A threaded fastener 670, such as a nut or other suitable component, is then screwed onto the end of the ball screw 630 and affixed to the top surface of the retaining bracket 640. One end of the ball screw 630, such as the end nearest the lower mounting bracket 625 includes a ball screw gear 631, which engages with gear 520. The spring 650 exerts a downward force on the central portion 612 of the yoke 610. This force is related to the distance between the central portion 612 and the underside of the retaining bracket 640. FIG. 6B shows the tension system 110 in the position with maximum spring length and the minimum force exerted by the spring 650. Retaining bracket 640 is at its uppermost position, allowing the greatest length for the spring 650. FIG. 6C shows the tension system after the ball screw 630 has been rotated a plurality of times to bring the retaining bracket 640 closer to the lower mounting bracket 625. The length of the spring 650 is shorter, creating more downward force on the central portion 612 of the yoke 610. Thus, in operation, as the rotary motor 500 is actuated, it causes rotation of gear 520, which is coupled to ball screw gear 631. The rotation of the ball screw gear 631 causes linear movement of the retaining bracket 640, which varies the compression of the spring 650, which in turn determines the compression force applied by the fasteners to the faceplate 40. Note that while the figures show the ball screw gear 631 located near the lower mounting bracket 625, the configuration may be modified so that the ball screw gear is located near the upper mounting bracket 620.

Figure 7:
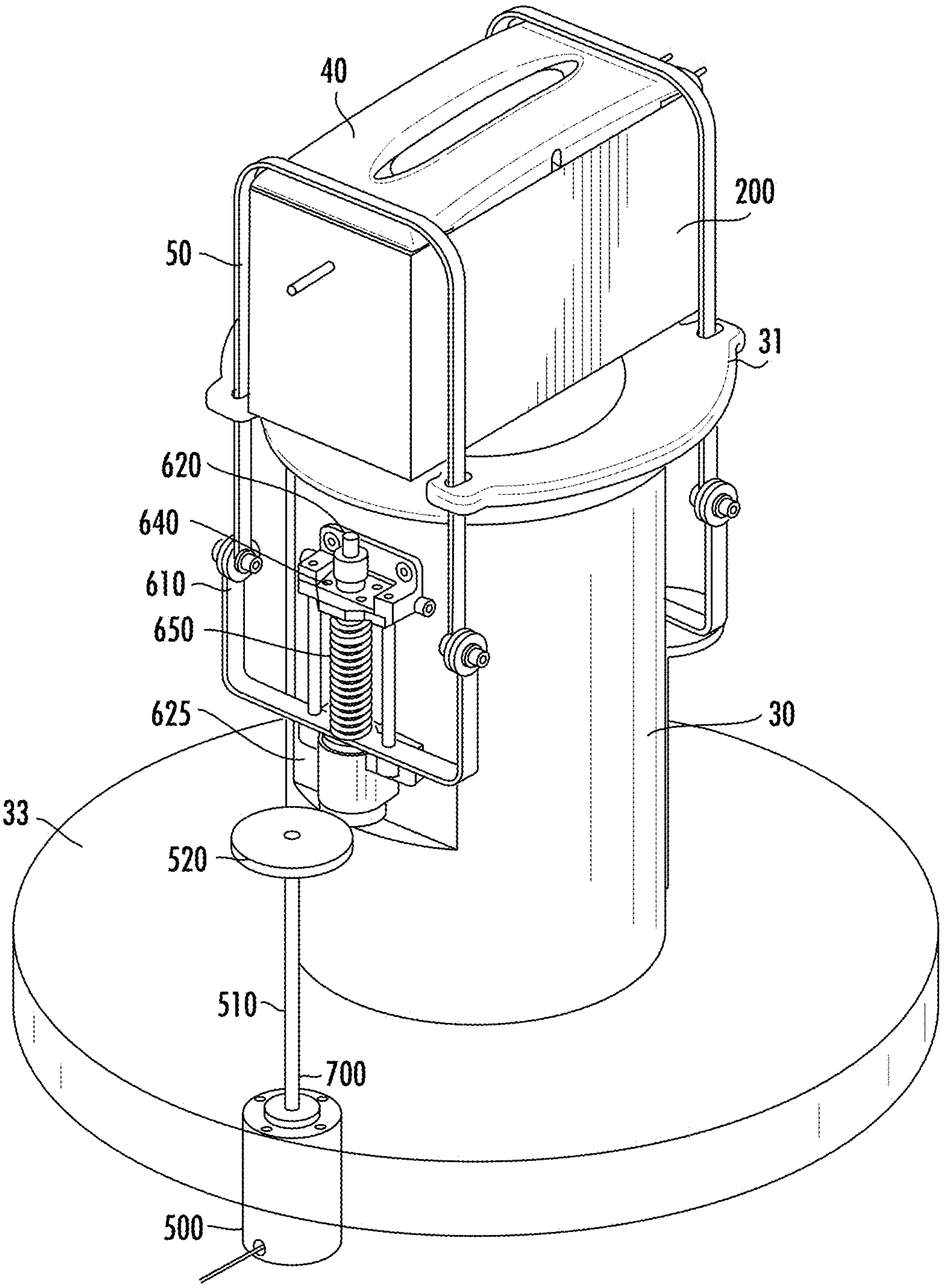
FIG. 7 shows the ion source with an adjustable tension system according to a second embodiment.

FIG. 7 shows a second embodiment of an adjustable tension system. In this embodiment, the tension system 110 is as described in FIGS. 6A-6C. However, in this embodiment, the shaft 510 and gear 520 are located outside of the source housing 30. The shaft 510 and the gear 520 are located in the vacuum chamber. In certain embodiments, the rotary motor 500 is located outside of the vacuum chamber, such as on the atmospheric environment on the opposite side of the lower flange 33 of the source housing 30. A vacuum flange 700 may be used to allow the shaft 510 to pass from the atmospheric environment to the vacuum chamber. In other embodiments, the rotary motor 500 may be disposed within the vacuum chamber. This configuration may allow additional space in the cavity within the source housing 30 to locate other components.

Figure 8:
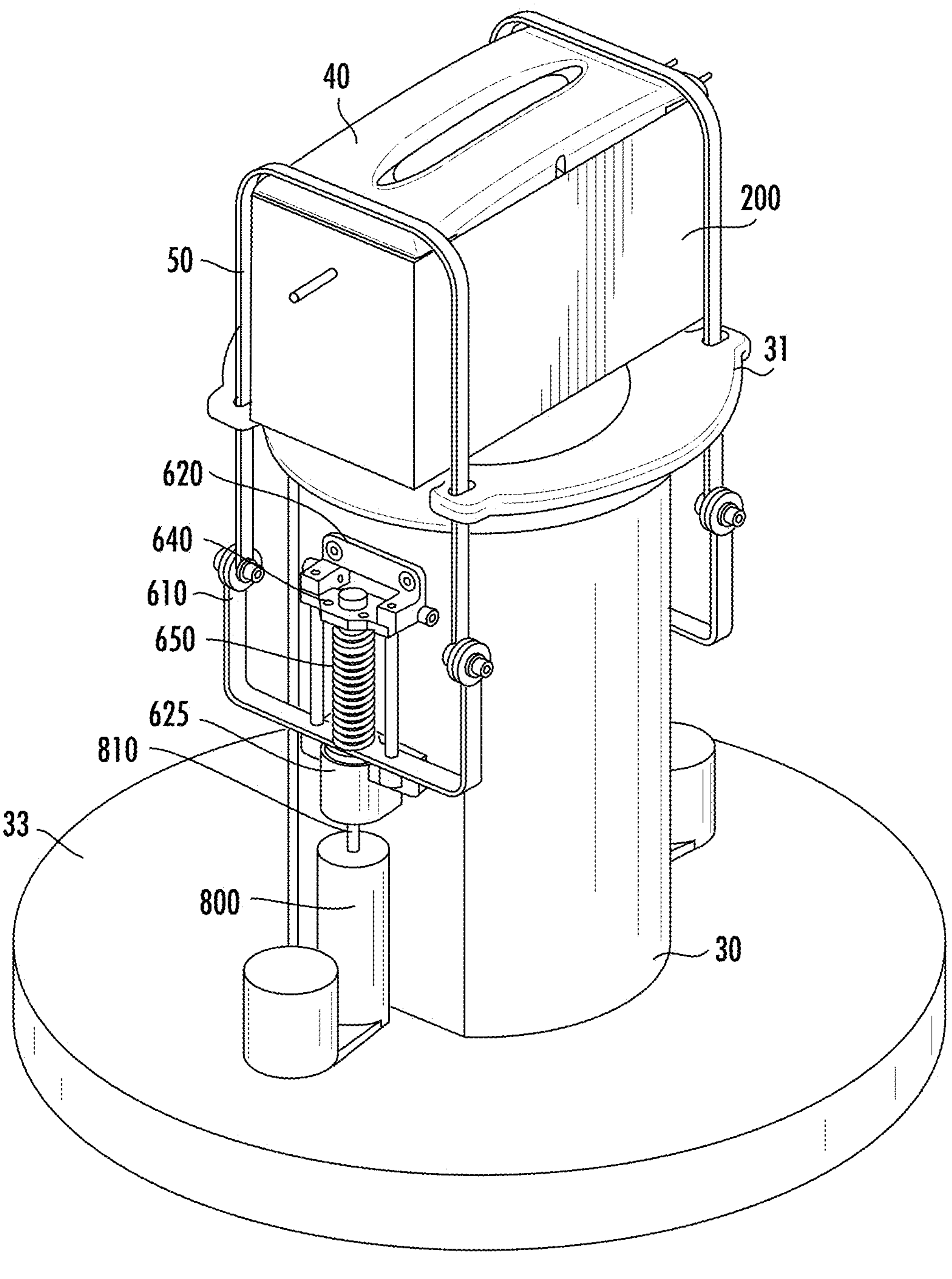
FIG. 8 shows the ion source with an adjustable tension system according to a third embodiment.

FIG. 8 shows a third embodiment of the ion source. In this embodiment, the actuator 120 is a linear actuator 800, having a shaft 810 that moves in a linear manner. Rather than a ball screw, the shaft 810 passes through the lower mounting bracket 625, the hole in the central portion 612 of the yoke 610 and through the interior of the spring 650. The shaft 810 is affixed to the retaining bracket 640. The remainder of the tension system 110 is similar to that shown in FIGS. 6A-6C. The linear actuator 800 may be disposed within the vacuum chamber as shown in FIG. 8. In another embodiment, the linear actuator 800 is located in the atmospheric environment, similar to the configuration in FIG. 7. In this embodiment, the shaft 810 passes through the lower flange 33 of the source housing 30 and extends to the retaining bracket 640. In this embodiment, movement of the shaft 810 directly causes linear movement of the retaining bracket 640 and compression of the spring 650.

Of course, the tension system 110 may be implemented in other ways, and is not limited to those shown herein.

Figure 9:
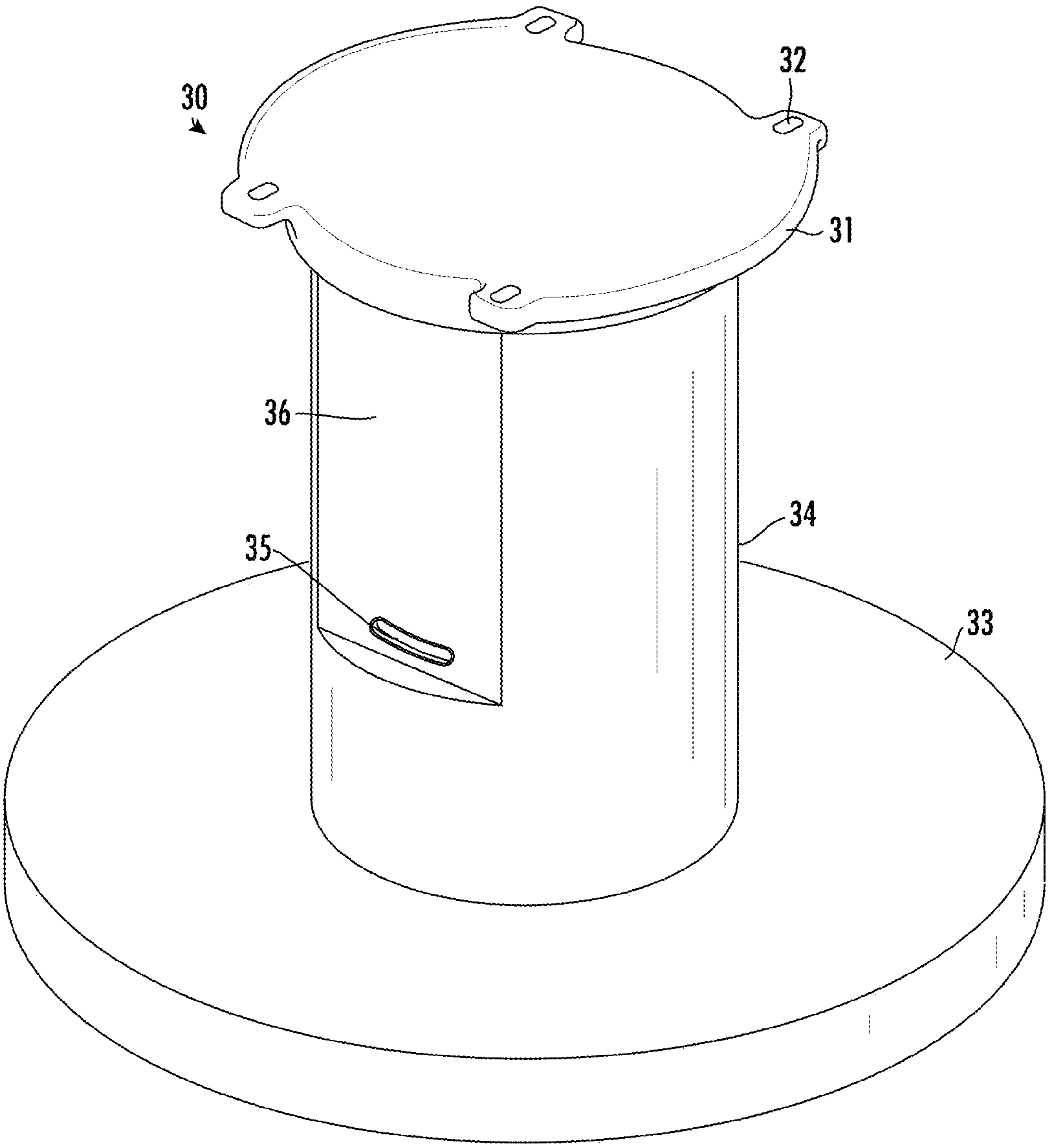
FIG. 9 shows a source housing that may be utilized with each of the embodiments.

FIG. 9 shows the source housing 30 in more detail. This source housing 30 may be utilized with any of the embodiments described above. As described above, the source housing 30 has a flange 31 located at or proximate the top surface. The flange 31 has a plurality of openings or slots 32, through which the fasteners pass. In certain embodiments, there may be a total of four slots 32. The bottom of the source housing 30 may include a lower flange 33. The source housing 30 include a housing body 34, which is defined as the region between the flange 31 and the lower flange 33. In certain embodiments, the interior of the housing body 34 may be hollow, allowing the inclusion of components, such as the actuators (as shown in FIG. 5). The exterior of the housing body 34 may be cylindrical. Two regions, located on opposite sides of the housing body 34 may be machined so as to form flat surfaces 36. The flat surfaces 36 may have a width ranging between 1 and 3 inches and a height ranging between 2 and 5 inches, although other dimensions are also possible. The flat surfaces 36 create a location where each tension system 110 may be mounted. This flat surface 36 may be used to mount the tension systems 110 of any of the embodiments shown in FIGS. 5, 7 and 8. Located within each flat surface 36 may be a slot 35, which passes from the interior of the housing body 34 to the exterior. The slot 35 allows the passage of a coupling, such as a gear, from the interior of the housing body 34 to the exterior of the housing body 34. This is useful in the embodiment shown in FIG. 5. Note that in other embodiments, the slot 35 may not be present.

Figure 10A:
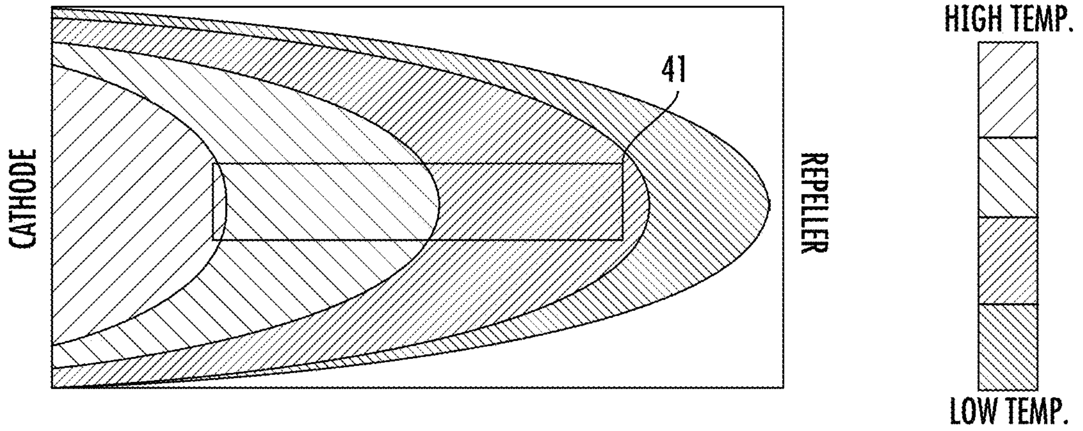
FIGS. 10A-10C show theoretical faceplate temperature gradients with various compression forces applied to each end of the faceplate.
Figure 10B:
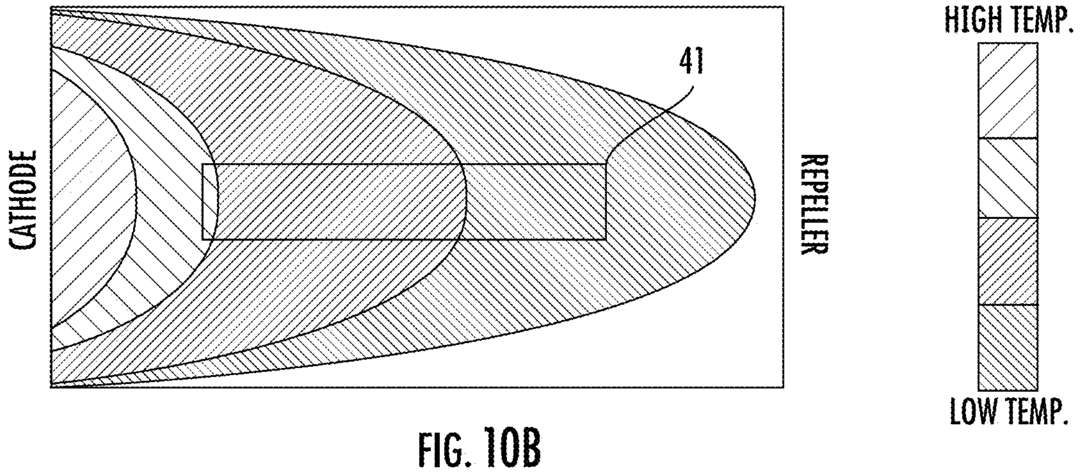
Figure 10C:
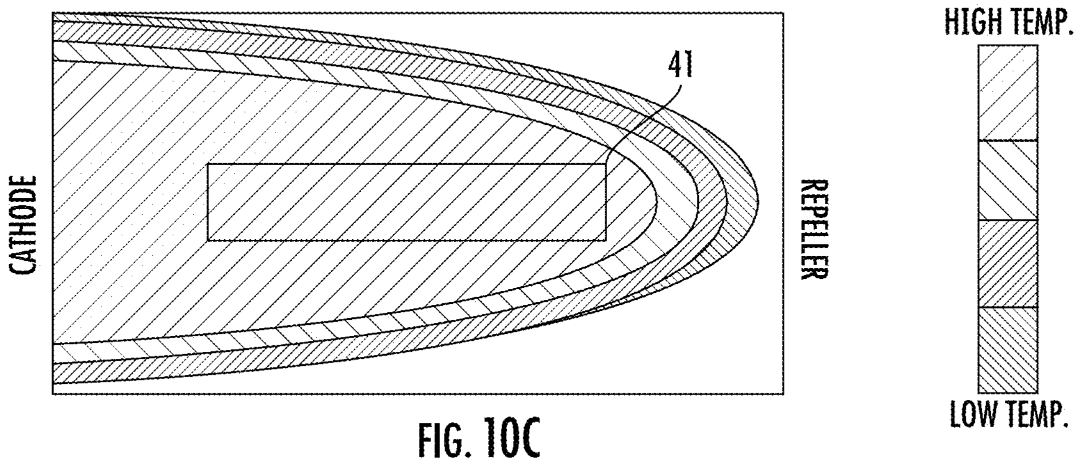

The embodiments described above in the present application may have many advantages. In one system design case, the cathode 210 is heated to a temperature that causes heat to be conducted to the faceplate 40 from the chamber walls 11. The temperature profile of the faceplate 40 with an equal moderate compression force on each end of the faceplate is shown in FIG. 10A. Note that roughly half of the extraction aperture 41 is in the medium-high temperature range, while the other half of the extraction aperture is in the medium-low temperature range. Temperature differences between the high and low temperature portions of the faceplate under this force condition may be in excess of 200°C. Thus, each temperature range may represent 50° C. or more. In FIG. 10B, the compression force is increased on the second end 202 of the faceplate 40 and reduced on the first end 201 of the faceplate 40. The resulting thermal resistance gradient between the faceplate 40 and chamber walls 11 causes less heat to be conducted from the first end 201 to the faceplate 40, and also increases the ability of the second end 202 of the arc chamber 200 to serve as a heat sink. Consequently, the temperature of the extraction aperture 41 is lowered, such that roughly half of the extraction aperture 41 is in the low temperature range and the remainder of the extraction aperture is in the medium-low temperature range. Thus, by having a compression force at the first end 201 that is less than the compression force at the second end 202, the overall temperature of the faceplate 40 may be decreased. In FIG. 10C, the compression force is increased on the cathode side (i.e. first end 201) of the faceplate 40 and reduced on the repeller side (i.e. the second end 202) of the faceplate 40. The resulting thermal contact gradient causes more heat to be conducted from the first end 201 to the faceplate 40, and also reduces the ability of the second end 202 of the arc chamber 200 to serve as a heat sink. Consequently, the entirety of the extraction aperture 41 is now in the high temperature range. Thus, by having a compression force at the first end 201 that is greater than the compression force at the second end 202, the overall temperature of the faceplate 40 may be increased.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:

an ion source comprising:

an arc chamber comprising a plurality of chamber walls and having a first end and a second end; and a faceplate having an extraction aperture disposed on a top of the plurality of chamber walls;

a source housing, wherein the arc chamber is disposed on the source housing;

a first fastener and a second fastener to press the faceplate against the top of the plurality of chamber walls of the arc chamber, wherein the first fastener is disposed near the first end and the second fastener is disposed near the second end; and a first adjustable tension system in communication with the first fastener to apply tension to the first fastener and a second adjustable tension system in communication with the second fastener to apply tension to the second fastener; and a controller, in communication with the first adjustable tension system and the second adjustable tension system, configured to apply different tensions to each fastener.

2. The ion implantation system of claim 1, wherein the tension applied to the first end, which is proximate to a cathode in the arc chamber, is greater than the tension applied to the second end so as to increase a temperature of the faceplate.

3. The ion implantation system of claim 1, wherein the tension applied to the first end, which is proximate to a cathode in the arc chamber, is less than the tension applied to the second end so as to decrease a temperature of the faceplate.

4. The ion implantation system of claim 1, wherein the controller receives an input, and based on the input, determines a desired tension for the first adjustable tension system and a desired tension for the second adjustable tension system.

5. The ion implantation system of claim 4, wherein the input is a feed gas species being used, a desired temperature, or a desired force.

6. The ion implantation system of claim 1, wherein each fastener comprises a strap, wherein the strap comprises an engagement portion that rests on the faceplate and two attachment portions, where the two attachment portions are coupled to a respective adjustable tension system.

7. An ion implantation system, comprising:

an ion source comprising:

an arc chamber comprising a plurality of chamber walls and having a first end and a second end; and a faceplate having an extraction aperture disposed on a top of the plurality of chamber walls;

a source housing, wherein the arc chamber is disposed on the source housing;

a first fastener and a second fastener to press the faceplate against the top of the plurality of chamber walls, wherein the first fastener is disposed near the first end and the second fastener is disposed near the second end; and a first adjustable tension system in communication with the first fastener to apply tension to the first fastener and a second adjustable tension system in communication with the second fastener to apply tension to the second fastener; wherein each adjustable tension system comprises an actuator and a tension system, wherein the tension system comprises a yoke to attach to a respective fastener, a retaining bracket, and a spring disposed between the yoke and the retaining bracket; and wherein the actuator includes a shaft and wherein movement of the shaft varies a distance between the retaining bracket and the yoke.

8. The ion implantation system of claim 7, wherein the source housing comprises a housing body having a cylindrical shape, and wherein flat regions are created on the housing body to mount the tension system.

9. The ion implantation system of claim 7, wherein the source housing comprises a flange disposed proximate to the arc chamber, wherein the flange is disposed between the arc chamber and the tension system; and wherein the flange comprises slots through which the fasteners pass.

10. The ion implantation system of claim 7, wherein the actuator comprises a linear actuator and the shaft is affixed to the retaining bracket.

11. The ion implantation system of claim 7, wherein each adjustable tension system further comprises a ball screw that passes through an interior of the spring and is rotatably coupled to the retaining bracket, wherein the actuator comprises a rotary motor, and a gear disposed at a distal end of the shaft, wherein the gear engages with a ball screw gear that turns the ball screw.

12. The ion implantation system of claim 11, wherein the source housing has a hollow interior, and wherein the tension system is mounted on an outside wall of the source housing and the actuator is disposed within the source housing.

13. The ion implantation system of claim 12, wherein a slot is disposed in the source housing connecting the hollow interior to the outside wall, wherein the gear extends through the slot to connect the actuator to the tension system.

14. The ion implantation system of claim 7, wherein the arc chamber and the source housing are disposed in a vacuum chamber, the tension system is mounted on an outside wall of the source housing and the actuator is disposed outside the vacuum chamber, such that the shaft passes from an atmospheric environment into the vacuum chamber.

15. An ion implantation system, comprising:

an ion source comprising:

an arc chamber comprising a plurality of chamber walls and having a first end and a second end; and a faceplate having an extraction aperture disposed on top of the plurality of chamber walls;

a source housing, wherein the arc chamber is disposed on the source housing;

a first fastener disposed near the first end and a second fastener disposed near the second end; and a first adjustable tension system in communication with the first fastener to apply tension to the first fastener and a second adjustable tension system in communication with the second fastener to apply tension to the second fastener, wherein each adjustable tension system comprises an actuator; and a controller, in communication with the first adjustable tension system and the second adjustable tension system, to supply a desired tension to each adjustable tension system, wherein the controller supplies a command signal to each adjustable tension system and receives a feedback signal from each adjustable tension system, wherein the feedback signal is indicative of actual tension experienced by each adjustable tension system.

16. The ion implantation system of claim 15, wherein the controller updates the command signal to each adjustable tension system based on a respective feedback signal.

17. The ion implantation system of claim 16, wherein the controller updates the command signal a plurality of times.

18. The ion implantation system of claim 17, wherein the controller updates the command signal at least once per minute.

* * * * *